(12) United States Patent
Yamada et al.

(10) Patent No.: US 8,456,896 B2
(45) Date of Patent: Jun. 4, 2013

(54) MAGNETORESISTANCE ELEMENT AND STORAGE DEVICE USING THE SAME

(75) Inventors: Michiya Yamada, Hino (JP); Yasushi Ogimoto, Higashiyamato (JP)

(73) Assignee: Fuji Electric Co., Ltd., Kawasaki-shi (JP)

(*) Notice: Subject to any disclaimer, the term of this patent is extended or adjusted under 35 U.S.C. 154(b) by 91 days.

(21) Appl. No.: 13/165,782

(22) Filed: Jun. 21, 2011

(65) Prior Publication Data

US 2011/0310660 A1 Dec. 22, 2011

Related U.S. Application Data

(63) Continuation of application No. PCT/JP2009/067237, filed on Oct. 2, 2009.

(30) Foreign Application Priority Data

Dec. 22, 2008 (JP) ................. 2008-325640

(51) Int. Cl.
*G11C 11/00* (2006.01)

(52) U.S. Cl.
USPC ............................. 365/158; 365/171; 365/173

(58) Field of Classification Search
USPC .............. 365/148, 158, 171, 173, 105, 115, 365/243
See application file for complete search history.

(56) References Cited

U.S. PATENT DOCUMENTS

| | | | |
|---|---|---|---|
| 5,615,180 A | | 3/1997 | Mieda et al. |
| 6,086,993 A * | | 7/2000 | Yoshinari et al. ............ 428/336 |
| 7,663,197 B2 * | | 2/2010 | Nagase et al. ................. 257/421 |
| 7,933,137 B2 * | | 4/2011 | Dimitrov et al. .............. 365/105 |
| 8,036,025 B2 * | | 10/2011 | Nagase et al. ................. 365/158 |
| 2004/0105305 A1 | | 6/2004 | Hayakawa |
| 2005/0040433 A1 | | 2/2005 | Nozieres et al. |
| 2006/0092696 A1 | | 5/2006 | Bessho |
| 2007/0086121 A1 | | 4/2007 | Nagase et al. |
| 2008/0186759 A1 | | 8/2008 | Shimizu et al. |

FOREIGN PATENT DOCUMENTS

| | | |
|---|---|---|
| JP | 6-302031 A | 10/1994 |
| JP | 2001-257395 A | 9/2001 |
| JP | 2004-179483 A | 6/2004 |

(Continued)

OTHER PUBLICATIONS

D.D. Djayaprawira et al, "230% room-temperature magnetoresistance in CoFeB/MgO/CoFeB magnetic tunnel junctions", Applied Physics Letters, vol. 86, 092502, 2005.

(Continued)

*Primary Examiner* — Gene Auduong
(74) *Attorney, Agent, or Firm* — Rabin & Berdo, P.C.

(57) ABSTRACT

A magnetic memory element having a memory cell of size $4F^2$ is provided that realizes a crosspoint-type memory. In the magnetic memory element, a first magnetic layer, a third magnetic layer (spin polarization enhancement layer), an intermediate layer, a fourth magnetic layer (spin polarization enhancement layer), and a second magnetic layer are stacked in order. The intermediate layer is made of an insulating material or a nonmagnetic material. The second magnetic layer is composed of a ternary alloy of gadolinium, iron and cobalt, a binary alloy of gadolinium and cobalt, or a binary alloy of terbium and cobalt. Alternatively, the first magnetic layer is composed of a ternary alloy of terbium, iron and cobalt, or a binary alloy of terbium and cobalt.

6 Claims, 6 Drawing Sheets

FOREIGN PATENT DOCUMENTS

| | | |
|---|---|---|
| JP | 2005-503669 T | 2/2005 |
| JP | 2006-128579 A | 5/2006 |
| JP | 2006-269866 A | 10/2006 |
| JP | 2007-142364 A | 6/2007 |
| JP | 2008-192916 A | 8/2008 |

OTHER PUBLICATIONS

J. Hayakawa et al, "Current-induced magnetization switching in MgO barrier based magnetic tunnel junctions with CoFeB/Ru/CoFeB synthetic ferrimagnetic free layer", Japanese Journal of Applied Physics, vol. 45, L1057-1060, 2006.

D.H. Lee et al, "Increase of temperature due to Joule heating during current-induced magnetization switching of an MgO-based magnetic tunnel junction", Applied Physics Letters, vol. 92, 233502, 2008.

S. Shimanuki et al, "Magnetic and Magneto-Optical Properties of Amorphous TbCo Films Prepared by Two Target Magnetron Co-sputtering", Journal of Magnetics Society of Japan, Mar. 31, 1986, vol. 10, No. 2, pp. 179 to 182.

* cited by examiner

MAGNETORESISTANCE ELEMENT AND STORAGE DEVICE USING THE SAME

This application is a continuation of International Application No. PCT/JP2009/067237, with an international filing date of Oct. 2, 2009, now abandoned, the subject matter of which is incorporated herein by reference, and claims the foreign priority benefit under 35 USC 119 of Japanese application Serial No. 2008-325640, filed on Dec. 22, 2008, the subject matter of which is incorporated herein by reference.

BACKGROUND OF THE INVENTION

1. Field of the Invention

The present invention relates to a magnetoresistance element to read out data using an magnetoresistance effect, and to a storage device using such a magnetoresistance element.

2. Background of the Related Art

In recent years, there have been remarkable increases in the storage capacity of nonvolatile semiconductor storage devices, of which flash memory is representative, and the release of products with capacities of approximately 32 gigabytes have been announced. Nonvolatile semiconductor storage devices are rapidly gaining commercial value as USB memory and storage for portable telephones in particular, and such inherently superior characteristics of solid-state element memory as resistance to vibration, high reliability, and low power consumption are attracting attention, so that such storage devices are becoming the mainstream of storage for portable music players for music and video, and other storage devices for portable electronic equipment.

On the other hand, separately from the above applications in storage devices, vigorous research is being performed aiming at realizing nonvolatile semiconductor storage devices with performance similar to that of DRAM (dynamic random-access memory), which is currently used as the main memory of information equipment. A goal of this research is to realize a so-called "instant-on computer", that is, a computer which can be started instantly at the time of use, with vanishingly little power consumed during standby. It is said that a memory element of such nonvolatile semiconductor storage element must satisfy the technical specifications, required of DRAM, of (1) a switching time of less than 50 ns, and (2) a number of rewrite cycles exceeding $10^{16}$. The lower limit for the number of rewrite cycles ($10^{16}$) given in the above technical specifications is a numerical figure proposed on the basis of the number of accesses when the device is accessed once every 30 ns, continuously for 10 years. When a nonvolatile storage device is used as mainframe memory, refresh cycles are unnecessary, and so use in applications similar to those of current DRAM is possible even with a smaller number of rewrite cycles.

As candidates for such next-generation nonvolatile semiconductor storage devices, research and development is being performed on nonvolatile memory elements based on various principles, such as ferroelectric memory (FeRAM), magnetic memory (MRAM), phase-change memory (PRAM), and similar. However, MRAM using magnetoresistance elements as memory elements is regarded as the most promising candidate to replace DRAM and satisfying the above technical specifications. Below, memory elements using magnetoresistance elements are called "magnetic memory elements". Although MRAM is at the prototype level, performance on the level of $10^{12}$ or more rewrite cycles has been attained, and operation is also fast, with switching times under 10 ns, so that among nonvolatile storage devices the feasibility of realization is high compared with other technologies.

The biggest problem with this MRAM is that the area occupied by one memory cell (the cell area) is large, and this is accompanied by high cost. Specifically, small-capacity RAM of approximately 4 Mbits which is currently being commercialized is the current magnetic-field rewrite type, and if the minimum feature size of the manufacturing process is F, then the cell area is 20 to 30 $F^2$ or greater, and microminiaturization of cells themselves is difficult. Further, in current magnetic-field rewrite type MRAM, when the cell area is microminiaturized, the reversal magnetic field (that is the minimum value as an external magnet field to reverse the magnetization) increases, and there is the problem that as the degree of integration is raised and microminiaturization advances, the current value necessary for the magnetization reversal increased. Because of these problems, replacement of DRAM with current magnetic-field rewrite type MRAM is not practical.

In response to these circumstances, two breakthrough technologies are changing matters. One is a method employing MTJs (magnetic tunnel junctions) using an MgO tunnel barrier insulating film; a magnetoresistance ratio of 200% or higher is easily obtained (see D. D. Djayaprawire et al, "230% room-temperature magnetoresistance in CoFeB/MgO/CoFeB magnetic tunnel junctions", Applied Physics Letters, Vol. 86, 092502, 2005). Another is a current-induced magnetization switching method. In particular, in the current-induced magnetization switching method, there are no difficulties with microminiaturization arising from basic principles, as in the above increase in the reversal magnetic field accompanying microminiaturization; on the contrary, microminiaturization results in a decrease in current to reverse the magnetization according to a scaling rule, so that with microminiaturization, the write energy can be reduced. By means of this current-induced magnetization switching method, memory cells can be configured which use one transistor per magnetic tunnel junction (MTJ), so that it is predicted that cell areas can ideally be reduced to from 6 to $8F^2$, that is, comparable to DRAM (see J. Hayakawa et al, "Current-induced magnetization switching in MgO barrier based magnetic tunnel junctions with CoFeB/Ru/CoFeB synthetic ferrimagnetic free layer", Japanese Journal of Applied Physics, Vol. 45, L1057-1060, 2006). Below, a configuration in which a memory cell uses one transistor per magnetic tunnel junction (MTJ) is called a "one transistor-one MTJ configuration". Further, aiming at a small cell area (approximately $4F^2$) on a par with flash memory, there has also been a proposal of a memory cell configuration which uses one diode per MTJ (a "one diode-one MTJ configuration") (see Japanese Patent Laid-open No. 2004-179483). And, there has also been a proposal, in an element provided with a driving layer in which the magnetization direction is substantially fixed in the stacking direction, in which the number of transistor types is reduced from two to one by using only one current polarity to simplify the circuit, and realizing a one transistor-one MTJ circuit with cell size reduced to be comparable to DRAM (see Japanese Patent Laid-open No. 2006-128579).

However, in the above proposal of a one diode-one MTJ configuration disclosed in Japanese Patent Laid-open No. 2004-179483, switching is performed using currents in both the directions of the forward bias and the reverse bias via the diode. That is, switching is performed using the current in the forward-direction bias (forward-direction current) and the leak current in the reverse-direction bias, and there is no change in the principle of performing switching by means of current polarity. Here, a diode is originally formed in order to select MTJs without disturbance (crosstalk) in write, erase, and read operations, and leak currents flow not only in the reverse direction, but in the forward direction also. According to the above proposal, which employs as a principle of operation the occurrence of switching by a leak current in a reverse-direction bias, a current of value sufficient for use in switching also flows at low voltages when biased in the forward direction. Hence using the above operation principle, the effect in preventing disturbances is inadequate. That is, in cases in which switching by a reverse-bias leak current is possible, current flows even at low voltages for forward-direction bias, and a problem of disturbances similar to that of simple matrix-type memory without element selection switching cannot be avoided, so that a highly integrated element cannot be realized. In this way, in order to realize crosspoint-type memory employing a one diode-one MTJ configuration having a minimum cell area of $4F^2$, a conventional current-induced magnetization switching method employing the operation principle of switching through the current polarity cannot be adopted.

Further, in the proposal disclosed in Patent Document 2, that is, the proposal of a one transistor-one MTJ configuration using an element provided with a driving layer the magnetization direction in which is substantially fixed in the stacking direction, a method is used to perform switching in which spin precession is caused by spin injection from the driving layer into a free layer. By means of this method, switching is possible using current which in principle has only one polarity. However, in the principle of operation of causing spin precession by spin injection from the driving layer, there is the problem that magnetization arrangements (combinations of magnetization directions) in which the directions of magnetization in the free layer (recording layer) and pinned layer (fixed-magnetization layer) are either parallel or antiparallel tend to be either parallel or antiparallel. Further, in this proposal there is the concern that the direction of magnetization in the pinned layer (fixed-magnetization layer) may change, and so the problem occurs that with respect to achieving a number of rewrite cycles comparable to DRAM, reliability may be reduced.

The present invention was devised in light of the above problems, and has as an object the provision of a magnetic memory element with a one diode-one MTJ configuration which performs switching using only one current polarity, which until now had been difficult, that is, a magnetic memory element with a one diode-one MTJ configuration which can perform switching operations using single-polarity electric pulses, as well as a storage device using such a magnetic memory element, and by this means contributing to further compactness, larger capacities, and higher upper limits for the number of rewrite cycles of nonvolatile semiconductor storage devices.

SUMMARY OF THE INVENTION

The inventors of this application returned to the basic characteristics of magnetization in the magnetic materials used in MRAM to examine the above problems, and again studied the conditions for operation as a memory element. To this end, the inventors of this application first considered that, by making the magnetic material used in the recording layer an alloy of a rare earth and a transition metal ("rare earth-transition metal alloy"), the magnetic characteristics of the recording layer could be made N-type ferrimagnetic. In N-type ferrimagnetic material, a phenomenon is observed in which the magnetization of the transition metal element contained therein and the magnetization of the rare earth metal mutually cancel at a certain temperature, so that the net magnetization is zero. The temperature at which this net magnetization is zero is called the magnetic compensation temperature. And, the inventors of this application focused on the fact that in a memory element having such a recording layer, it is possible to cause the net magnetization direction of the recording layer to be reversed through the temperature of element. That is, using such a recording layer, the above phenomenon is used in switching the direction of magnetization of the recording layer, so that a write operation can be performed to direct the magnetization of the recording layer in the same direction or the reverse direction of the pinned layer by means of a single-polarity current, and memory cells with a one diode-one MTJ configuration are made possible. The above principle of operation is described in further detail in the first embodiment. In this way, the inventors of this application conducted specific studies to make the magnetic characteristics of the recording layer N-type ferrimagnetic, and by this means arrived at the invention of the magnetic memory element and nonvolatile storage device described below.

That is, the magnetic memory element of one mode of the invention has first to fourth magnetic layers and an intermediate layer, in which the third magnetic layer is formed on the first magnetic layer, the intermediate layer is formed on the third magnetic layer, the fourth magnetic layer is formed on the intermediate layer, and the second magnetic layer is formed on the fourth magnetic layer; the intermediate layer is made of an insulating material or a nonmagnetic material, and the second magnetic layer is selected from the group consisting of a ternary alloy thin film of gadolinium, iron and cobalt, a binary alloy thin film of gadolinium and cobalt, and a binary alloy thin film of terbium and cobalt.

In the above mode, the second magnetic layer is used as a recording layer. The magnetic material used as the recording layer is a rare earth-transition metal alloy, and because the magnetic characteristics are N-type ferromagnetism, the net magnetization direction of the recording layer is reversed depending on the temperature of the magnetic memory element. Through this phenomenon, the direction of magnetization of the recording layer can be controlled by a current with the same polarity (a single-polarity current or monopolar current), whether the write operation directs the direction of the recording layer magnetization in the same direction or the reverse direction of the first magnetic layer (pinned layer), and so each memory cell can have a one diode-one MTJ configuration.

In the above mode of the present invention, it is preferable that the first magnetic layer be a ternary alloy thin film of terbium, iron and cobalt, and a terbium composition ratio in the ternary alloy of the first magnetic layer of 13 to 22 at. % is preferable.

By making the terbium composition ratio 13 to 22 at. %, the first magnetic layer (pinned layer) becomes a perpendicular magnetization film, and moreover the magnetic compensation temperature becomes sufficiently low, such as for example equal to or lower than the temperature at which the storage device is operated, so that in the first magnetic layer, the Tb composition ratio can prevent reduction of the magnetization due to a rise in temperature of the element during writing. In the description of this application, "at. %" is the same as atomic percent and molar percent, and represents the ratio of number of atoms or molar ratio of components when the total of the composition ratios of all components is 100 at. %.

In the above mode of the invention, it is preferable that the first magnetic layer is a binary alloy thin film of terbium and cobalt, and a terbium composition ratio in the binary alloy of the first magnetic layer of 13 to 22 at. % is preferable.

By making the terbium composition ratio 13 to 22 at. %, the first magnetic layer becomes a perpendicular magnetization film, and moreover the Tb composition ratio can be made smaller than the compensation composition ratio at the temperature at which the storage device is operated, that is, the magnetic compensation temperature of the binary alloy of the first magnetic layer can be made lower than the temperature at which the storage device is operated. Hence even if the temperature of element rises during writing, the temperature of the first magnetic layer, rather than approaching the compensation temperature $T_{comp}$, recedes therefrom. Hence by making the terbium composition ratio 13 to 22 at. %, reduction of the magnetization in the pinned layer (first magnetic layer) can be suppressed. Here, the compensation composition ratio means the minimum value of the composition rate of the rare earth element in the alloy composition for which the magnetic moment of the rare earth element exceeds the magnetic moment of the transition metal element, and is a value determined for different temperatures. In addition, a binary alloy of terbium and cobalt is more resistant to oxidation than a ternary alloy of terbium, iron and cobalt. Hence deterioration of the characteristics of the magnetic memory element can be improved.

In the above mode of the invention, it is preferable that the second magnetic layer be a binary alloy thin film of gadolinium and cobalt, and that the gadolinium composition ratio in the binary alloy of this second magnetic layer be 23 to 28 at. %.

By this means, the compensation temperature of the recording layer (second magnetic layer) exists in the range 100 to 180° C., so that as described below, by executing control such that the temperature of the recording layer is above or below the magnetic compensation temperature due to Joule heating caused by the write current, the direction of magnetization in the recording layer can be controlled through the temperature.

In the above mode of the invention, it is preferable that the second magnetic layer be a binary alloy thin film of terbium and cobalt, and that the terbium composition ratio in the binary alloy of the second magnetic layer be 22 to 26 at. %.

By this means, the compensation temperature of the recording layer (second magnetic layer) exists in the range 100 to 180° C., so that as described below, by executing control such that the temperature of the recording layer is above or below the magnetic compensation temperature due to Joule heat caused by the write current, the direction of magnetization in the recording layer can be controlled through the temperature.

Further, the inventors of this application examined the above problems, and discovered that by making the magnetic characteristics of the pinned layer N-type ferrimagnetic, changes in the magnetic characteristics of the pinned layer can be utilized to control the magnetization direction in the recording layer. That is, focusing on the fact that the net magnetization direction in the pinned layer can be reversed by the temperature of element, by transferring the magnetization of the pinned layer before and after the reversal to the recording layer magnetization direction by means of a single-polarity current, a write operation can be performed in which the magnetization of the recording layer is directed either in the same direction or the reverse direction of the pinned layer, and a one diode-one MTJ configuration can be used in each element. Regarding the above operation principle, a more detailed description is given in the fourth embodiment. And as another mode of this application, through more specific studies to make the magnetic characteristics of the pinned layer N-type ferrimagnetic, the inventors of this application arrived at invention of the following magnetic memory element and nonvolatile storage device.

That is, the magnetic memory element of another mode of the invention has first to fourth magnetic layers and an intermediate layer, in which the third magnetic layer is formed on the first magnetic layer, the intermediate layer is formed on the third magnetic layer, the fourth magnetic layer is formed on the intermediate layer, and the second magnetic layer is formed on the fourth magnetic layer; the intermediate layer is made of an insulating material or a nonmagnetic material, and the first magnetic layer is selected from the group consisting of a ternary alloy thin film of terbium, cobalt and iron, and a binary alloy thin film of terbium and cobalt.

In the above mode of the invention, it is preferable that the first magnetic layer be a ternary alloy of terbium, iron and cobalt, and that the terbium composition ratio in the ternary alloy of the first magnetic layer be 25 at. % to 29 at. %.

By this means, the magnetic compensation temperature in the first magnetic layer (pinned layer) exists in the range 100 to 180° C., so that as stated below, by executing control such that the temperature of the recording layer is above or below the magnetic compensation temperature due to Joule heat caused by the write current, the direction of magnetization in the pinned layer can be controlled through the temperature.

In the above other mode of the invention, it is preferable that the second magnetic layer be a thin film of an alloy comprising gadolinium and cobalt. Compared with TbFeCo, GdCo has a lower magnetic anisotropy energy, and moreover the magnetization Ms tends to be lower than in TbFeCo, so that by using this as the recording layer, the write current is easily reduced. In this case, it is still more preferable that the second magnetic layer be a ternary alloy thin film with iron further added to the gadolinium and cobalt, and with the composition ratio of gadolinium in the ternary alloy of the second magnetic layer from 10 at. % to 17 at. %, or from 23 at. % to 40 at. %.

Figure 9A:
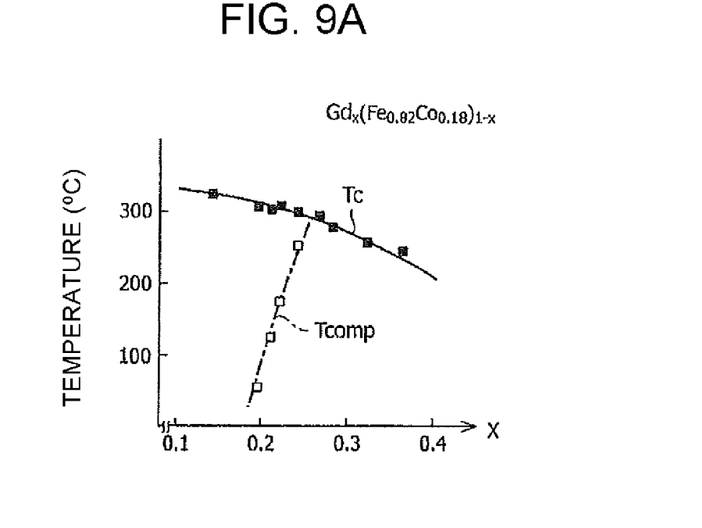
FIG. 9 is a graph showing the gadolinium dependence of Curie temperature and magnetic compensation temperature in alloys of gadolinium and iron, and in alloys of gadolinium, iron and cobalt.
Figure 9B:
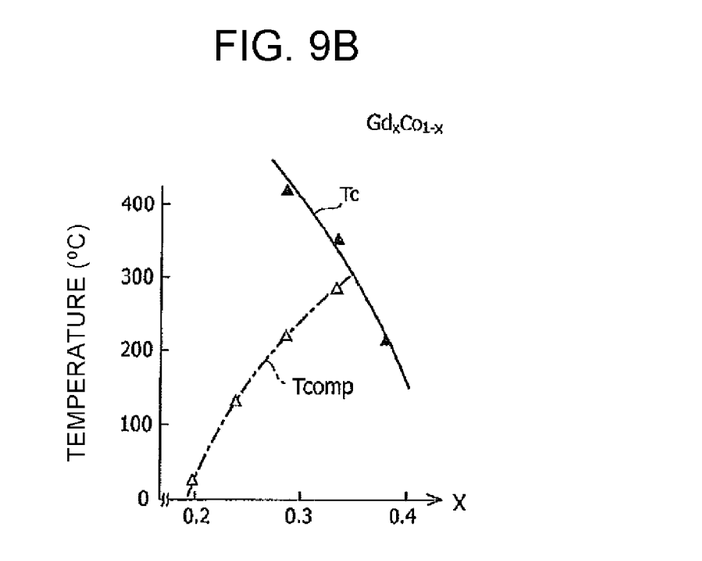

Advantageous results of the above configuration can be understood from the properties of alloys comprising gadolinium and cobalt, or from ternary alloys of this with iron further added. In Japanese Patent Laid-open No. H6-302031, the values of Tc (Curie temperature) and $T_{comp}$ (magnetic compensation temperature) of a ternary alloy $Gd_x(Fe_{0.82}Co_{0.18})_{1-x}$ of gadolinium, iron and cobalt are shown for different gadolinium composition ratios. FIGS. 9 (a) and (b) reproduce these. According to this disclosure, for both $Gd_xCo_{1-x}$ and for $Gd_x(Fe_{0.82}Co_{0.18})_{1-x}$, a sufficiently high Tc is obtained at the composition ratios at which a $T_{comp}$ exists, in other words, at the composition ratios at which characteristics are N-type ferrimagnetic; and when such alloys are used in the second magnetic layer, write operations can be performed appropriately.

In particular, for a second magnetic film which is a ternary alloy thin film with iron added to gadolinium and cobalt, as shown in the figure, when the gadolinium composition ratio is 20 at. % or higher, the value of $T_{comp}$ at different values of the gadolinium composition ratio is high compared with cases in which the second magnetic film is $Gd_xCo_{1-x}$. For example, the value of $T_{comp}$ for x=0.25 (a gadolinium composition ratio of 25 at. %) is approximately 160° C. for $Gd_xCo_{1-x}$, but is approximately 260° C. for $Gd_x(Fe_{0.82}Co_{0.18})_{1-x}$. For this reason, when the first magnetic film reaches a temperature exceeding its own magnetic compensation temperature (for example, 150° C.), when the second magnetic film which is at the same temperature is a ternary alloy in which iron is added to gadolinium and cobalt, compared with the case in which the second magnetic film is $Gd_xCo_{1-x}$, the temperature interval until the magnetic compensation temperature of the second magnetic film itself is reached is larger. Hence even when variation in the temperatures reached by magnetic memory elements is considered when manufacturing a storage device in which magnetic memory elements are integrated, in the case in which the second magnetic film is a ternary alloy in which iron is added to gadolinium and cobalt, operation of the storage device can be expected to be stable compared with the case in which the second magnetic film is $Gd_xCo_{1-x}$. The range of gadolinium composition ratios of the alloy thin film used as a second magnetic film over which such an advantageous result can be obtained is 23 at. % to 40 at. %. The ternary alloy compositions shown here are only $Gd_x(Fe_{0.82}Co_{0.18})_{1-x}$, but it has been confirmed that by adjusting the relative ratio of iron and cobalt, the upper limit to the gadolinium composition ratio for which the above advantageous result is obtained is 40 at. %.

Further, it is known that in the range (not shown) in which the gadolinium composition ratio is approximately 0.2 or lower, in contrast with the above relation, when the second magnetic film is the above alloy thin film, the value of $T_{comp}$ for each of the gadolinium composition ratio values is lower compared with the case in which the second magnetic film is $Gd_xCo_{1-x}$. In this case also, the temperature interval until $T_{comp}$ from the lower-limit value of the temperature of the second magnetic film when manufacturing a magnetic memory element is higher for the case when the second magnetic film is a ternary alloy with iron added to gadolinium and cobalt, compared with the case in which the second magnetic film is $Gd_xCo_{1-x}$. Hence even when the above-described temperature variation is considered, when the second magnetic film is a ternary alloy with iron added to gadolinium and cobalt, compared with the case in which the second magnetic film is $Gd_xCo_{1-x}$, stable operation of the storage device can be expected. The range of gadolinium composition ratios for which this advantageous result is obtained is 10 at. % to 17 at. %.

In this way, when the second magnetic film is a ternary alloy with iron added to gadolinium and cobalt, by setting the gadolinium composition ratio anywhere in the range 10 at. % to 17 at. % or 23 at. % to 40 at. %, even when the temperature of the first magnetic layer (pinned layer) varies within the operating temperature range of the storage device, operation is such that only the first magnetic layer spans the magnetic compensation temperature, and the second magnetic layer does not span the magnetic compensation temperature, so that the monopolar operation described below can be realized.

In the above other mode of the invention, it is preferable that the first magnetic layer be a binary alloy thin film of terbium and cobalt, and that the terbium composition ratio in the binary alloy of the first magnetic layer be from 22 to 26 at. %.

By this means, the magnetic compensation temperature in the first magnetic layer (pinned layer) exists in the range 100 to 180° C., so that as stated below, by executing control such that the temperature of the recording layer is above or below the magnetic compensation temperature due to Joule heat caused by the write current, the direction of magnetization in the pinned layer can be controlled through the temperature.

In the above other mode of the invention, it is preferable that the second magnetic layer be a binary alloy thin film of gadolinium and cobalt, and that the gadolinium composition ratio in the binary alloy of the second magnetic layer be from 27 to 39 at. %.

By this means, even when there is a rise in temperature due to Joule heat caused by the write current, the second magnetic layer (recording layer) does not span the magnetic compensation temperature, so that only the first magnetic layer (pinned layer) is made to span the magnetic compensation temperature, and the magnetization can be reversed.

In the above other mode of the invention, it is preferable that the second magnetic layer be a binary alloy thin film of terbium and cobalt, and that the terbium composition ratio in the binary alloy of the second magnetic layer be from 27 to 32 at. %.

By this means, even when there is a rise in temperature due to Joule heat caused by the write current, the second magnetic layer (recording layer) does not span the magnetic compensation temperature, so that only the first magnetic layer (pinned layer) is made to span the magnetic compensation temperature, and the magnetization can be reversed.

Also, in any of the above modes of the invention, it is preferable that the molar ratio of iron to cobalt of each of the compositions of the first magnetic layer be 7:3.

By this means, by making Fe:Co=7:3, the magnetization of the transition metal (iron and cobalt) portion of the magnetization of the first magnetic layer (pinned layer) is maximized, and the net magnetization of the pinned layer also increases. By increasing the magnetization of the pinned layer, disordering of the magnetization of the pinned layer by the current magnetization reversal operation (or current-induced magnetization switching, spin transfer torque (STT)) does not easily occur, and stable operation is possible.

Further, typically in any of the modes of the present invention, the third and fourth magnetic layers are used as spin polarization enhancement layers, but the present invention is not limited to such examples.

As one mode of the present invention, a nonvolatile storage device is provided. That is, a nonvolatile storage device is provided comprising any one of the magnetoresistance elements described in the present invention and a rectifying element connected in series thereto, and characterized in comprising information rewrite means for performing writing and erasure by passing a current to the magnetoresistance element, and readout means for reading out stored information from an amount of current flowing through the magnetoresistance element.

By means of a nonvolatile storage element with the above characteristics, switching using single-polarity electric pulses is possible, so that a memory cell comprising one diode-one MTJ can be realized, and a cell area of approximately $4F^2$, comparable to that of flash memory, can be achieved. In this way, by means of the present invention magnetic memory cells provided with fast operation and a high number of rewrite cycles can be integrated with high density on a silicon wafer or other substrate, so that a high-performance nonvolatile storage device can be provided at low cost.

A magnetic memory element and storage device of the present invention can perform reliable switching operation through single-polarity electric pulses, so that memory cells with a one diode-one MTJ configuration and of size $4F^2$ can be realized. By this means, a low-cost, high-density nonvolatile storage device can be realized.

DETAILED DESCRIPTION OF THE INVENTION

Below, embodiments of magnetic memory elements and storage devices of the invention are explained based on the drawings.

First Embodiment

Figure 1:
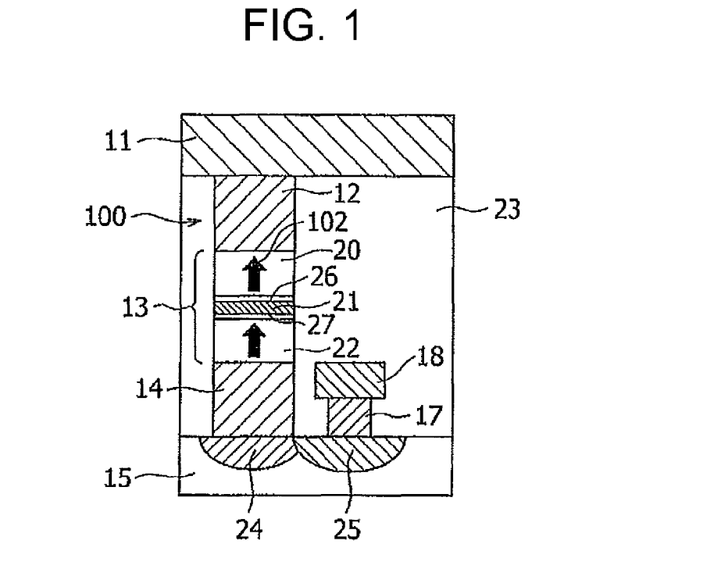
FIG. 1 is a cross-sectional view showing the structure of a magnetic memory element of first to seventh embodiments of the invention.
Figure 2:
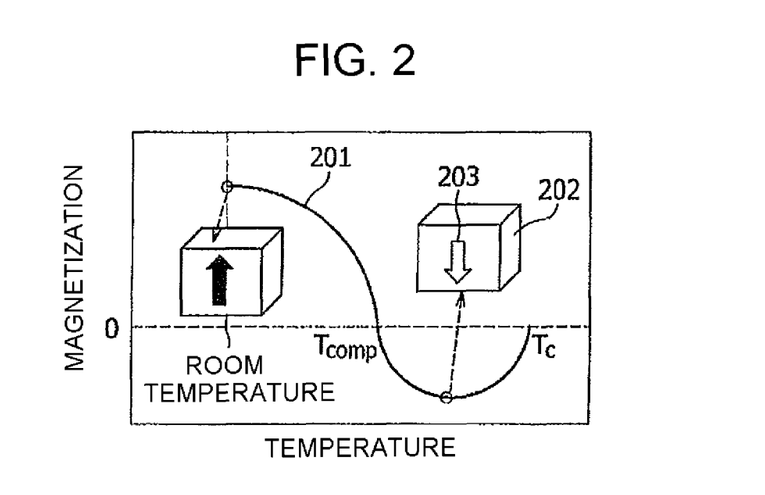
FIG. 2 is a temperature characteristic diagram indicating the relation between magnetization and temperature of an N-type ferrimagnetic material.
Figure 3A:
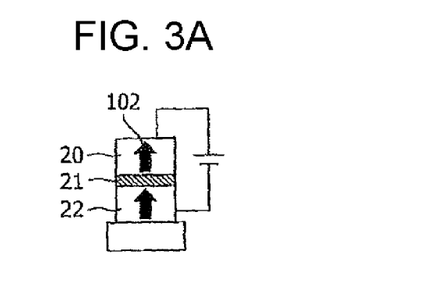
FIG. 3 is a schematic diagram of the principle of operation of a magnetic memory element in the first to third embodiments of the invention.
Figure 3B:
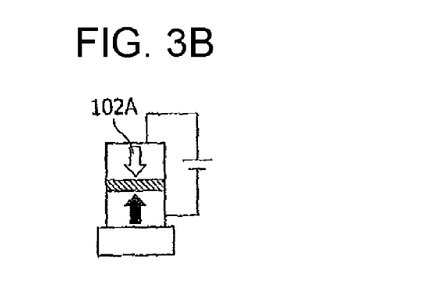
Figure 3C:
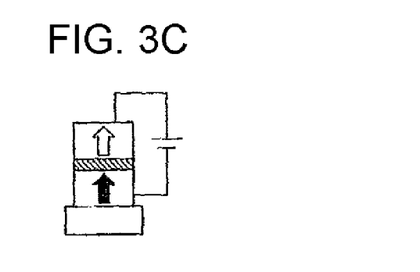
Figure 3D:
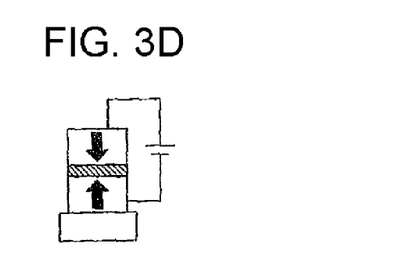
Figure 4A:
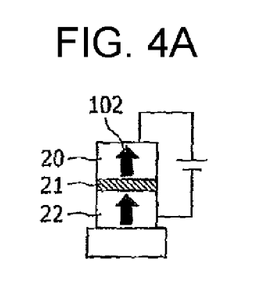
FIG. 4 is a schematic diagram of the principle of operation of a magnetic memory element in the fourth to seventh embodiments of the invention.
Figure 4B:
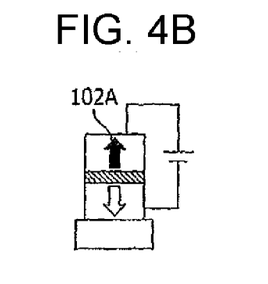
Figure 4C:
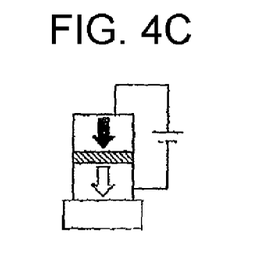
Figure 4D:
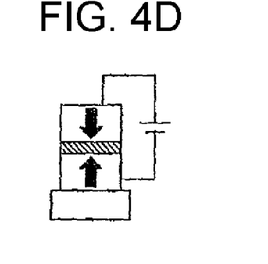

In a first embodiment of the invention, the structure of a memory element and principle of write operation in the embodiment of the invention are explained based on FIG. 1 to FIG. 3, and a method of manufacture thereof and technical advantageous results are explained.

Structure of Magnetic Memory Element

FIG. 1 is an enlarged cross-sectional view showing a portion of the magnetic memory element 100 of a storage device 10 comprising the magnetic memory element. The magnetic memory element 100 has a magnetic tunnel junction (MTJ) portion 13; this MTJ portion 13 is sandwiched between a lower electrode 14 and an upper electrode 12. The MTJ portion 13 has a structure in which are stacked, in order from the side of the lower electrode 14, a pinned layer 22 (first magnetic layer), first spin polarization enhancement layer 27 (third magnetic layer), insulating layer 21, second spin polarization enhancement layer 26 (fourth magnetic layer), and recording layer 20 (second magnetic layer); the pinned layer 22 and recording layer 20 are rare earth-transition metal alloys, which are a type of N-type ferrimagnetic material. The lower electrode 14 is fabricated on a P-type region 24 formed in the substrate 15, and in the substrate 15 is also formed an N-type region 25 so as to be in contact with the P-type region 24. The combination of the P-type region 24 and N-type region 25 forms a diode (rectifying element). Further, on the N-type region 25 are layered, in order, a contact portion 17 and a word line 18. On the other hand, the upper electrode 12 is connected to a bit line 11. The word line 18 and bit line 11 are insulated by an interlayer insulating film 23 and each connected to a control circuit (not shown). The storage device 10 comprises numerous magnetic memory elements 100, and reads information stored in a target magnetic memory element according to a memory address, and writes information to a magnetic memory element 100. In this embodiment, the pinned layer 22 comprises a thin film of a TbFeCo alloy, and the recording layer 20 comprises a thin film of a GdCo alloy, manufactured so that the respective magnetic compensation temperatures are 0° C. or lower and approximately 150° C.

Magnetic Memory Element Write Operation: Parallel

Next, the principle enabling write operation to a magnetic memory element 100 manufactured in this way by a single-polarity electric pulse is explained. In a write operation to direct the direction of magnetization of the recording layer 20 in the same direction as the direction of magnetization of the pinned layer 22, the same current-induced magnetization switching (spin transfer torque, STT) operation as in conventional magnetic memory elements is performed. That is, a tunneling current is passed from the recording layer 20, through the intermediate layer 21, to the pinned layer 22. At this time, the spin of electrons flowing from the pinned layer 22 to the recording layer 20 is polarized, and while current flows, the magnetization in the recording layer 20 receives a torque from these polarized-spin electrons. This torque acts to direct the magnetization direction in the recording layer 20 in the same direction as the magnetization direction in the pinned layer 22, so that the magnetization is directed in the same direction in the recording layer 20 and in the pinned layer 22, and is parallel. A magnetic memory element 100 in which the magnetization arrangement is parallel is in a state which exhibits a low resistance value between the pinned layer 22 and the recording layer 20 (low-resistance state).

Magnetic Memory Element Write Operation: Antiparallel

Next, write operation to direct the magnetization direction of the recording layer 20 in the direction opposite the magnetization direction of the pinned layer 22 is explained. The operation principle explained here is based on the understanding of the inventors of this application, and should be used only for the purpose of explanation. FIG. 2 is an example of the temperature characteristic of magnetization in an N-type ferrimagnetic material, and is here taken to be the temperature characteristic of the recording layer 20. In FIG. 2, a magnetization curve 201 for N-type ferrimagnetic material is shown, and magnetic material 202 is schematically illustrated with arrows indicating the direction of magnetization 203. As the temperature rises, the net magnetization of the magnetic material 202 of the recording layer 20 declines according to the magnetization curve 201, reaching 0 at the magnetic compensation temperature $T_{comp}$. Then, as the temperature continues to rise, the direction of the net magnetization is reversed relative to the original direction. In the present invention, this phenomenon in which the magnetization direction of the recording layer 20 is reversed at and above the magnetic compensation temperature is utilized to perform a write operation. FIG. 3 is used to explain a write operation in the magnetic memory element 100 using this phenomenon.

At the start of the operation, suppose that the magnetization in the recording layer 20 and the magnetization in the pinned layer 22 are in the same direction (FIG. 3 (a)). At this time, when the recording layer 20 is heated and the temperature becomes equal to or higher than the magnetic compensation temperature $T_{comp}$, the magnetization direction of the recording layer 20 is directed in the opposite direction due to the above-described phenomenon (FIG. 3 (b)). When, with this magnetization arrangement preserved, a tunnel current is passed from the recording layer 20 to the pinned layer 22, spin-polarized electrons flow from the pinned layer 22 to the recording layer 20. At this time, the magnetization in the recording layer 20 receives a torque from these electrons so as to direct the magnetization direction in the same direction as in the pinned layer 22, and the magnetization direction is reversed (FIG. 3 (c)). After magnetization reversal, when the recording layer 20 is adequately cooled to for example the normal temperature during operation of the storage device, on the opposite side of the magnetic compensation temperature $T_{comp}$ from when the temperature was raised, the net magnetization is oppositely directed, and so the magnetization in the recording layer 20 is opposite the magnetization in the pinned layer 22. That is, the magnetization arrangement is antiparallel (FIG. 3 (d)). A magnetic memory element 100 in which the magnetization arrangement is antiparallel is in a state which exhibits a high resistance value between the pinned layer 22 and the recording layer 20 (high-resistance state).

Next, a method of heating the recording layer 20 to realize a rise in temperature in order to obtain an antiparallel arrangement in this embodiment of the invention is explained. In this embodiment of the invention, Joule heat caused by the write current is used to heat the recording layer 20. In the magnetic memory element 100 of this embodiment, during writing a current (write current) is passed from the recording layer 20 to the pinned layer 22, and due to this write current, the magnetic memory element 100 is heated. The temperature rise due to this heating is calculated to be approximately +70 K to +150 K in D. H. Lee et al, "Increase of temperature due to Joule heating during current-induced magnetization switching of an MgO-based magnetic tunnel junction", Applied Physics Letters, Vol. 92, 233502, 2008; if the temperature of the MTJ portion 13 of the magnetic memory element 100 prior to the rise in temperature is 30° C., then the temperature reached by the MTJ portion 13 is approximately 100° C. to 180° C. Here, the temperature reached due to the temperature rise can be controlled to be an arbitrary temperature within the above temperature range by changing the range of the write current pulse width in the range, for example, 10 nsec to 1 msec. Hence by making adjustments such that for example the magnetic compensation temperature of the recording layer 20 is approximately 150° C. and similar, so that the magnetic compensation temperature of the recording layer 20 exists in the range of temperatures reached in which control is possible (100° C. to 180° C.), by controlling the pulse width of the write current the net magnetization direction can be caused to be reversed.

The current direction to obtain the above-described parallel magnetization arrangement, and the current direction to obtain the antiparallel magnetization arrangement, are both the current direction shown in FIG. 3; the only difference between the two is the difference in the temperature of the recording layer 20. As in the above, even when using a single-polarity current, by changing the pulse width the magnetic memory element 100 in the first embodiment can be written so that the magnetization direction of the recording layer 20 is parallel to that in the pinned layer, or is antiparallel.

Pinned Layer Composition

As the TbFeCo of the pinned layer, it is preferable that the Tb composition ratio be 13 to 22 at. %. When the Tb composition ratio is approximately in the range 13 to 32 at. %, TbFeCo is a perpendicular magnetization film. However, if the Tb composition ratio is set to a composition ratio exceeding the compensation composition ratio at room temperature, so that for example the Tb composition ratio is set to 23 to 32 at. %, due to the rise in temperature caused by the write current, the temperature of the pinned layer approaches the magnetic compensation temperature, and the magnetization of the pinned layer declines. In STT operation, the magnetization of the pinned layer must be sufficiently high with respect to the recording layer, and there is the concern that such a decline in magnetization could cause STT operation to be unstable. Hence as the Tb composition ratio of the pinned layer, it is desirable that a composition ratio be used such that the magnetic compensation temperature is lower than the temperature at which the storage device operates. Such Tb composition ratio is 13 to 22 at. %. In particular, if 13 at %, which is the composition ratio at the limit for a perpendicular magnetization film, is used, the net magnetization is maximum, which is ideal; but using actual sputtering methods it is difficult to manufacture a thin film with uniform composition across the entire region of the deposited film, so that a margin of approximately 1 to 2 at. % is necessary, or in other words, a Tb composition ratio of 15 at. % can be regarded as most preferable.

Further, in the TbFeCo of the pinned layer, it is preferable that the composition ratio of Fe to Co be 7:3. This is because, by replacing a portion of the Fe in TbFe with Co, the magnetization of the transition metal (Fe, Co) portion increases, and is maximum at the point Fe:Co=7:3. In STT, it is preferable that the magnetization of the pinned layer be sufficiently high compared with the magnetization of the free layer in order that there be no disordering during writing. Hence a relative composition ratio of Fe:Co=7:3, at which the pinned layer magnetization is high, is preferable.

Recording Layer Composition

In order to realize the above operation in this embodiment, it is preferable that the magnetic compensation temperature of the recording layer 20 be set in the range of temperature reached by the recording layer 20, that is, in the range 100 to 180° C. As for the composition of GdCo alloys having a magnetic compensation temperature in this range, it is preferable that the Gd composition ratio be 23 to 28 at. %, and in this embodiment GdCo in this range is used. Of these, if the Gd composition ratio is 26 at. % and the Co composition ratio is 74 at. % in particular, the magnetic compensation temperature is substantially at the center of the range of temperatures reached (150° C.), and temperature control becomes easy, so that this composition is most preferable.

Spin Polarization Enhancement Film and Intermediate Layer

The first spin polarization enhancement film (third magnetic layer) and second spin polarization enhancement film (fourth magnetic layer) of the magnetic memory element 100 of this embodiment are explained. A spin polarization enhancement film is a magnetic film in which spin is completely polarized with respect to the Δ1 band, as for example in Fe, FeCo, and FeCoB. This polarization enhancement layer is combined with an insulating layer (intermediate layer) having fourfold symmetry with respect to the stacking direction, such as MgO, to realize a spin tunnel junction, and by this means the effective spin polarization can be heightened. It has become clear both theoretically and experimentally that by optimizing conditions in such a structure, a magnetoresistance ratio of approximately 1000% can be obtained.

Method of Manufacture

Below, a method of manufacture of the magnetic memory element manufactured in the first embodiment is explained. Again referring to FIG. 1, first a CMOS process is used to form the P-type region 24 and N-type region 25 on the Si substrate (silicon wafer). Then, a magnetron sputtering method is used to deposit Al (5 nm), and a photolithography process is used to form the lower electrode 14 on the P-type region 24 and the contact 17 on the N-type region 25. Further, in a state in which the resist film used in the photolithography remains, a plasma CVD (chemical vapor deposition) process is used to form an interlayer insulating film (SiN) to a film thickness of approximately 5 nm, and the resist film is then dissolved with acetone or NMP (N-methyl-2-pyrrolidone) and washed away. Then, the SiN film on the lower electrode 14 and contact 17 is lifted off together with the resist film (washed away), to obtain a state in which the surfaces of the lower electrode 14 and contact 17 are exposed. A magnetron sputtering method is then used to deposit Cu film (10 nm), and photolithography is used to form the word line 18 on the contact 17.

Next, a magnetron sputtering method is used to deposit, in order, TbFeCo (5 nm), FeCo (1 nm), MgO (1 nm), FeCo (1 nm), GdCo (2 nm), Ta (5 nm), Ru (5 nm), and Ta (3 nm), and a photolithography process is used to microfabricate the above stacked film into a circular element of diameter 50 to 100 nm. This circular element comprises, from below, the pinned layer 22, first spin polarization enhancement layer 27, insulating layer 21, second spin polarization enhancement layer 26, recording layer 20, and upper electrode 12. At this time, with the resist film remaining, a plasma CVD process is used to deposit the interlayer insulating film (SiN) so that the film thickness is approximately 60 nm, and the resist film used in the previous photolithography process is dissolved using acetone or NMP and washed away. Then the interlayer insulating film (SiN) adhering to the upper electrode 12 is removed by a lift off process together with the resist film, and the surface of the upper electrode 12 is exposed. Next, magnetron sputtering is used to deposit, in order, Ta (10 nm), Cu (500 nm), and Ta (10 nm), and photolithography is used to fabricate the Ta/Cu/Ta stacked portion into the shape of a bit line. In this way, the magnetic memory element of this embodiment can be manufactured.

In this embodiment, it was stated that the pinned layer is TbFeCo, and that as the composition it is preferable that the terbium (Tb) composition ratio be 15 (±1) at. %, and that the atomic composition ratio of iron (Fe) to cobalt (Co) be 7:3. As a method to achieve this, a $Tb_{15}Fe_{60}Co_{25}$ alloy target can be used in magnetron sputtering to deposit a thin film, and if the composition of the thin film does not coincide with the above composition, a Tb piece and Co piece may be placed on the target to fine-adjust the composition, to fabricate a thin film with the above composition as the pinned layer. However, Tb has a lower sputtering rate than does Fe, so that if an alloy target with a Tb composition ratio approximately 2 to 3 at. % higher is used, a thin film with the above composition can be more easily deposited as the pinned layer. Further, similarly to the pinned layer, the GdCo of the recording layer can also be formed by magnetron sputtering using a $Gd_{26}Co_{74}$ alloy target, or using an alloy target with the Gd composition ratio increased by approximately 2 to 3 at. %.

Technical Advantageous Results of the First Embodiment

Next, the technical advantageous results of the magnetic memory element of the first embodiment, or of a storage device using this element, are explained. As stated above, the $Gd_{26}Co_{74}$ used as the recording layer 20 has a magnetic compensation temperature of approximately 150° C., near the center of the temperature range over which temperature control through the pulse width of the STT write current is possible. That is, control can be performed in which the STT write current polarity is not changed, but merely by changing the pulse width, the temperature reached by the recording layer 20 can be made lower than or higher than the magnetic compensation temperature, and so control can be performed such that the magnetization direction of the recording layer 20 is directed either in the same direction as the pinned layer 22 (parallel) or in the opposite direction (antiparallel) thereto. Hence through the above operation, a memory cell with a one diode-one MTJ configuration, and of size $4F^2$, can be realized.

Further, the $Tb_{15}Fe_{59}Co_{26}$ used as the pinned layer is a perpendicular magnetization film, and moreover the magnetic compensation temperature is below the lower limit of the temperatures at which a recording device operates, so that even when the element temperature rises due to a write current, the reduction in magnetization is gradual, at approximately −20%. Hence there is no excessive reduction of the pinned layer magnetization to detract from reliability during write operations. On the other hand, in the case of the $Gd_{26}Co_{74}$ used in the recording layer, operation is at a temperature close to the magnetic compensation temperature whether inducing a parallel state or an antiparallel state as a result of a rise in temperature due to the write current. In particular, if the precision of temperature control is increased, writing can be performed to induce a parallel state or an antiparallel state at a temperature near that at which the magnetization is zero. Hence the low magnetization of the recording layer means a reduced write current, which is preferable from the standpoints of high integration and reduction of power consumption.

Second Embodiment

A second embodiment of the invention is explained. The second embodiment is an embodiment in which, in the first embodiment, TbCo is used in the pinned layer. TbCo has oxidation resistance superior to that of TbFeCo, and if the magnetic memory element of this embodiment is used in a storage device, the lifetime of the storage device can be lengthened. Further, the magnetization of TbCo is lower than that of TbFeCo, so that the shape anisotropy energy is reduced, and an increase in the perpendicular-direction magnetic anisotropy energy Ku can be expected. An increase in the perpendicular magnetic anisotropy energy Ku leads to improved thermal stability. When thermal stability of the pinned layer is low, the magnetization direction is disordered upon excessive heating of the magnetic memory element, and the magnetic memory element no longer operates normally. Hence by improving thermal stability using TbCo in the pinned layer, the reliability of the storage device can be improved.

Except for the fact that a TbCo alloy thin film is used in place of a TbFeCo alloy thin film as the pinned layer, the method of manufacture of the magnetic memory element of this embodiment is substantially the same manufacturing method as in the first embodiment, and so an explanation is omitted. As the Tb composition ratio of the TbCo alloy thin film used as the pinned layer, a composition ratio in the range 13 to 22 at. % is preferable, and in particular a Tb composition ratio of 15±1 at. % is most preferable. By means of the above configuration, operation similar to that of the first embodiment can be realized, a memory cell with a one diode-one MTJ configuration and $4F^2$ size is possible, and a storage device using this magnetic memory element and with improved performance can be realized.

Third Embodiment

A third embodiment of the invention is explained. The third embodiment is an embodiment in which TbCo is used as the recording layer in the first embodiment or the second embodiment. TbCo has a magnetic anisotropy energy an order of magnitude greater than that of GdCo, and so by using TbCo in the recording layer, stored data retention characteristics can be improved. In the prior art, if the magnetic anisotropy energy of the recording layer is increased, there is the problem that the write current increases; but in this embodiment the temperature of the recording layer during writing approaches the magnetic compensation temperature, and the magnetization becomes extremely low, so that increases in the write current are suppressed and this problem is alleviated.

As the TbCo of the recording layer in this embodiment, it is preferable that the Tb composition ratio be in the range 22 to 26 at. %. Similarly to the case of the first embodiment, this is because the magnetic compensation temperature of the recording layer exists in the range 100 to 180° C. In particular, by making the Tb composition ratio 24 at. %, the magnetic compensation temperature of the recording layer is substantially at the center (150° C.) of the range over which the recording layer temperature can be controlled, and the allowable range of controlled temperatures is extended, which is most preferable.

In the above embodiments, TbFeCo and TbCo were used as the pinned layer (first magnetic layer); but FePt, CoCrPt, CoCrPt—$SiO_2$, or other perpendicular magnetization films can be used as the pinned layer to manufacture a magnetic memory element with structure similar to that of the first to third embodiments. In particular, these perpendicular magnetization films exhibit a high magnetic anisotropy energy, and so a magnetic memory element with higher reliability can be manufactured.

Fourth Embodiment

A fourth embodiment of the invention is explained. The fourth embodiment differs from the first embodiment in that, at the time of a write operation, writing is performed by controlling the temperature of the pinned layer instead of the recording layer so as to be higher than or lower than the magnetic compensation temperature, the magnetization direction of the recording layer is caused to be in the same direction as the magnetization direction of the pinned layer when there is no temperature rise (parallel) or to be in the opposite direction (antiparallel).

Principle of Operation

First, the principle of write operation in the fourth embodiment is explained. The write operation when directing the magnetization directions in the recording layer 20 and in the pinned layer 22 in the same direction is entirely the same as in the first embodiment, and so an explanation is omitted.

Next, a write operation to direct the magnetization direction of the recording layer 20 in the direction opposite that of the pinned layer 22 is explained using FIG. 4. The operation principle described here is also based on the understanding of the inventors of this application, and should be used only for the purpose of explanation. In this embodiment, it is hereafter assumed that the magnetic compensation temperature $T_{comp}$ of the recording layer 20 is 200° C. or higher, and that the compensation temperature $T_{comp}$ of the pinned layer 22 is approximately 150° C. First, at the start of the operation, it is assumed that the magnetization of the recording layer 20 and the magnetization of the pinned layer 22 are in the same direction (parallel) (FIG. 4 (a)). Suppose that by passing a write current in the direction from the recording layer 20 to the pinned layer 22, the Joule heat causes the temperature of the MTJ portion 13 of the magnetic memory element 10 to rise, to reach a temperature of approximately 170° C. At this time, the temperature reached by the pinned layer 22 exceeds the magnetic compensation temperature $T_{comp}$ thereof, so that the direction of magnetization of the pinned layer 22 is directed in the opposite direction (FIG. 4 (b)). On the other hand, the temperature of the recording layer 20 does not reach the magnetic compensation temperature $T_{comp}$ thereof, and so the magnetization direction of the recording layer 20 remains unchanged. At this time, spin-polarized electrons flow from the pinned layer 22 toward the recording layer 20, so the magnetization of the recording layer 20 receives a torque from the polarized electrons so as to direct the magnetization in the same direction as the magnetization of the pinned layer 22, and the magnetization is reversed (FIG. 4 (c)). After magnetization reversal, when the current is cut off the pinned layer 22 cools naturally, and when the element temperature falls below the magnetic compensation temperature $T_{comp}$ of the pinned layer 22, the net magnetization is reversed. In this way, the magnetization direction of the pinned layer 22 is directed in the direction opposite the magnetization of the recording layer 20 (FIG. 4 (d)). In this way, a write operation in which the magnetization of the recording layer 20 is directed in the direction opposite the magnetization of the pinned layer 22 is realized.

Pinned Layer Composition

Figure 5:
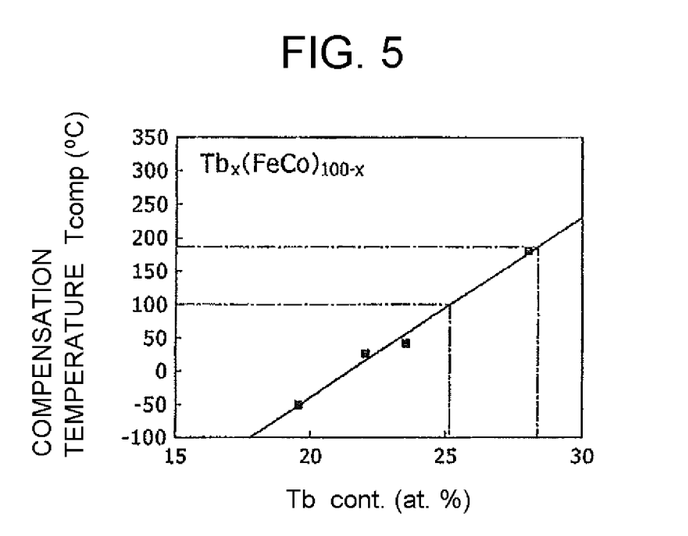
FIG. 5 is a graph showing the relation of magnetic compensation temperature to Tb composition ratio of TbFeCo.

In order to realize the above write operation, it is desirable that the magnetic compensation temperature $T_{comp}$ of the pinned layer 22 be in the temperature range 100° C. to 180° C.; as such materials, TbFeCo with a Tb composition ratio of 25 at. % to 29 at. % can be used. This is because the compensation temperature $T_{comp}$ of TbFeCo alloy changes with the Tb composition ratio as shown in FIG. 5, and in the above range of Tb composition ratios, the magnetic compensation temperature is in the temperature range 100° C. to 180° C. In particular, if the Tb composition ratio in the TbFeCo alloy of the pinned layer 22 is 28 at. %, the magnetic compensation temperature is approximately 150° C., and temperature can easily controlled through the write current, which is preferable. Further, for reasons similar to those in the first embodiment, in this embodiment it is still more preferable that the molar ratio of Fe to Co be 7:3. That is, the material most suitable as the pinned layer 22 in this embodiment can be said to be $Tb_{28}Fe_{50}Co_{22}$.

Recording Layer Composition

With respect to the recording layer 20 on the other hand, if the magnetic compensation temperature of the recording layer 20 is within the range of temperatures reached (approximately 25 to 200° C.), the above write operation becomes impossible. Hence, either 200° C. or higher, or 25° C. or less, which is the magnetic compensation temperature of arbitrary magnetic films, is appropriate for a magnetic compensation temperature of the recording layer 20, and the recording layer 20 is not limited to those described in the first to third embodiments. As an example which satisfies the conditions of a perpendicular magnetization film, GdFeCo with a Gd composition ratio of 23 at. % to 40 at. % or 10 at. % to 17 at. % is preferable. In particular, a Gd composition ratio of 17 at. % or of 23 at. % lowers the magnetization of the recording layer 20, and so is preferable.

Technical Advantageous Results of the Fourth Embodiment

Next, technical advantageous results of the magnetic memory element of the fourth embodiment or of a storage device using this magnetic memory element are explained. By means of this embodiment also, merely by changing the pulse width of the write current having a single polarity, the magnetization direction of the recording layer can be controlled to be in the same direction as the pinned layer or in the opposite direction thereto. Hence similarly to the first to third embodiments, in the fourth embodiment also, a memory cell with a one diode-one MTJ configuration and of size $4F^2$ can be manufactured.

Fifth Embodiment

Figure 6:
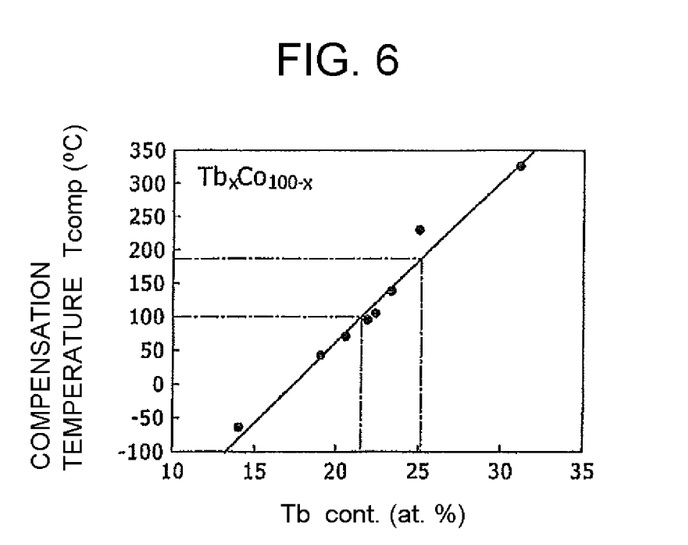
FIG. 6 is a graph showing the relation of magnetic compensation temperature to Tb composition ratio of TbCo.

A fifth embodiment of the invention is explained. The fifth embodiment is the fourth embodiment, with TbCo used in the pinned layer. In this case, in order make the magnetic compensation temperature of the TbCo of the pinned layer between 100 and 180° C. to realize operation equivalent to that of the fourth embodiment, the composition ratio of the Tb of the pinned layer is set in the range 22 to 26 at. %. This is because the magnetic compensation temperature $T_{comp}$ of the TbCo alloy changes with the Tb composition ratio as shown in FIG. 6. Switching operation using a single-polarity current pulse becomes possible, so that memory cells with a one diode-one MTJ configuration and $4F^2$ size can be manufactured. In particular, if the Tb composition ratio of the pinned layer is 24 at. %, the magnetic compensation temperature of the pinned layer 22 is approximately 150° C., and temperature control is made easier, which is preferable.

Sixth Embodiment

A sixth embodiment of the invention is explained. This embodiment is the fourth embodiment, with GdCo used in the recording layer 20. GdCo is more resistant to oxidation than is GdFeCo, and deterioration of the performance of the magnetic memory element can be alleviated. The principle of operation in this embodiment is substantially the same as in the fourth embodiment, and so an explanation is omitted. In this embodiment, in order to make the magnetic compensation temperature of the recording layer 20 equal to or greater than 200° C., the Gd composition ratio may be set to 27 at. % or higher. However, if the Gd composition ratio is 40 at. % or higher, the Curie temperature is 200° C. or lower, and it is difficult to realize the above-described write operation. Hence a Gd composition ratio in the range 27 to 39 at. % is necessary. From the above, even when using GdCo in the recording layer 20, a memory cell with a one diode-one MTJ configuration and $4F^2$ size can be manufactured similarly to the fourth embodiment. In particular, by making the amount of Gd 27 at. % or 39 at. %, due to element heating during writing the magnetic compensation temperature or Curie temperature is approached, so that the magnetization decreases to near zero, and the necessary write current can be reduced, which is more preferable.

Seventh Embodiment

A seventh embodiment of the invention is explained. The seventh embodiment is the fourth embodiment, with TbCo used in the recording layer. In this case if the Tb composition ratio is in the range 27 to 32 at. %, the film is a perpendicular magnetization film and moreover the magnetic compensation temperature is 200° C., so that operation equivalent to that above (in the fourth embodiment) can be realized, and a memory cell with a one diode-one MTJ configuration and $4F^2$ size can be manufactured. In particular, if the amount of Tb is 27 at. %, the magnetic compensation temperature is approximately 200° C., and due to element heating caused by the write current, the recording layer magnetization approaches zero, so that the write current is reduced, which is preferable. Also, because TbCo has a higher magnetic anisotropy energy than does GdFeCo, by using the magnetic memory element of this embodiment, stored data retention characteristics can be improved.

In the fourth to seventh embodiments, GdCo, GdFeCo, TbCo, and similar are used as free layer materials; but even when using FePt, CoCrPt, CoCrPt—$SiO_2$, and other perpendicular magnetization films, through operation equivalent to that of the above embodiments, a memory cell with a one diode-one MTJ configuration and $4F^2$ size can be manufactured.

Eighth Embodiment

Figure 7:
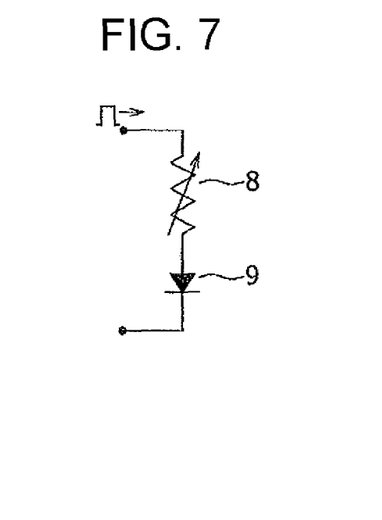
FIG. 7 schematically shows a magnetic memory element and rectifying element forming a crosspoint-type memory cell array, in one embodiment of a nonvolatile storage device of the invention.
Figure 8:
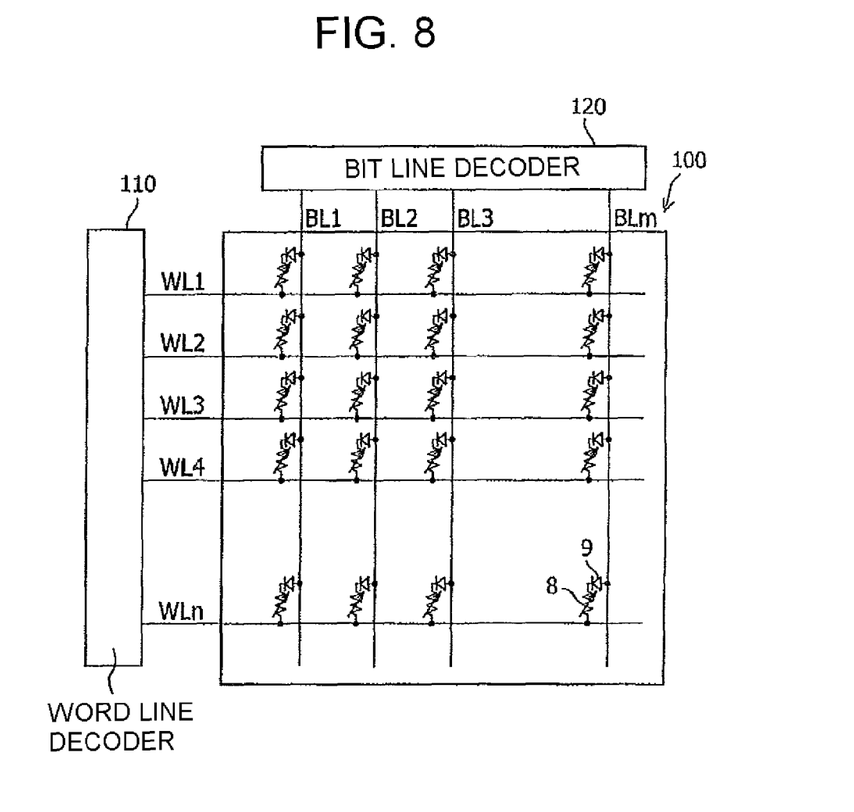
FIG. 8 is a block diagram of the circuit configuration of a crosspoint-type memory cell array, in one embodiment of a nonvolatile storage device of the invention.

Next, an embodiment of a nonvolatile storage device using the magnetic memory elements of other embodiments of the invention and diodes is explained, referring to FIG. 7 and FIG. 8.

FIG. 7 schematically shows the electrical configuration of a memory cell comprising a magnetic memory element and a rectifying element, in a crosspoint-type memory cell array which is an embodiment of a nonvolatile storage device of the invention. That is, as already explained, in a magnetic memory element and storage device of the present invention, switching using single-polarity electric pulses is possible. Hence rectifiers (here exemplified by diodes) are connected in series as element selection switches, and by forming upper electrodes and lower electrodes in a matrix of rows and columns, a storage device having a crosspoint-type memory is formed. For example, diodes can be formed in advance on Si substrate, and magnetic memory elements of an embodiment of the present invention can be formed thereupon. By applying positive-polarity electric pulses from the free layer side, switching can be performed efficiently.

Further, the maximum process temperature necessary for magnetic memory element manufacture in the present invention is at most approximately 350° C. for annealing, so that there is no loss of performance of the transistors for electric pulse supply or the diodes formed for cell selection switching formed below. Further, wiring can also withstand the above temperature of annealing, so that by employing a structure in which magnetic memory elements of the present invention are stacked in three dimensions, the memory capacity can be increased.

And, FIG. 8 is a block diagram showing the structure of the memory array of the nonvolatile storage device 100, in which memory cells using the magnetic memory element of FIG. 7 and rectifying elements are driven by word lines and bit lines. When memory content is written, the line corresponding to a word to be accessed is selected from among the world lines WLi (i=1 to n) by the word line decoder 110. A signal corresponding to the data to be written is applied, via a bit line BLj (j=1 to m) from the bit line decoder 120, to the corresponding memory cell in the row of memory cells connected to the selected word line. For example, the word lines of words not being accessed are maintained at high voltage and accessed, and through the action of the diodes 9 current is kept from flowing to the magnetic memory elements 8, and only the word line of the word being accessed is connected to GND. And, by taking the difference of bit line voltages, signals are applied from the bit line decoder 120 so as to achieve set operations or reset operations, according to the required data, for each of the memory cells connected to the accessed word line. The difference in the set operation and reset operation signals can be an arbitrary difference so as to execute control of the temperature reached by the MTJ portion of the magnetic memory element, but as stated above, it is preferable that single-polarity pulses with different pulse widths be used.

When reading out memory contents, a current detector portion (not shown), included in the bit line decoder 120 and provided corresponding to each bit line, detects current flowing in each bit line for the word line selected by the word line decoder operating similarly to a write operation, detects voltage values according to the resistances of the magnetic memory elements 8 corresponding to each of the bit lines in the word line of the word being accessed, and reads out the states of the magnetic memory elements 8.

In the above, embodiments of the invention have been described, but the invention is not limited to the aforementioned embodiments, and various modifications, alterations and combinations are possible based on the technical concept of the invention. For example, cases were explained in which the intermediate layer in each of the embodiments was an insulating material, but even when the intermediate layer is a nonmagnetic material, temperature control of the magnetic memory elements described in the various embodiments can be performed, and so the present invention can also be implemented using nonmagnetic materials in intermediate layers.

What is claimed is:

1. A magnetic memory element, comprising:
   a first magnetic layer;
   a third magnetic layer;
   an intermediate layer made of an insulating material or a nonmagnetic material;
   a fourth magnetic layer; and a second magnetic layer that is a thin film of an alloy selected from the group consisting of a ternary alloy of gadolinium, iron and cobalt, and a binary alloy of gadolinium and cobalt, wherein the layers are stacked in the order recited either in direct contact with one another, respectively, or with at least one other layer intervening.

2. The magnetic memory element according to claim 1, wherein the second magnetic layer comprises an N-type ferrimagnetic material having a magnetic compensation temperature of 20° C. or higher.

3. The magnetic memory element according to claim 1, wherein the first magnetic layer is a ternary alloy thin film of terbium, iron and cobalt, and wherein the ternary alloy of the first magnetic layer has a terbium composition ratio of 13 to 22 at. %.

4. The magnetic memory element according to claim 1, wherein the first magnetic layer is a binary alloy thin film of terbium and cobalt, and wherein the binary alloy of the first magnetic layer has a terbium composition ratio of 13 to 22 at. %.

5. The magnetic memory element according to claim 1, wherein the second magnetic layer is a binary alloy thin film of gadolinium and cobalt, and wherein the binary alloy of the second magnetic layer has a gadolinium composition ratio of 23 to 28 at. %.

6. A nonvolatile storage device, comprising:
a memory cell, having a magnetic memory element and a rectifier element connected in series to the magnetic memory element, the magnetic memory element further including:
   a first magnetic layer;
   a third magnetic layer;
   an intermediate layer made of an insulating material or a nonmagnetic material;
   a fourth magnetic layer; and
   a second magnetic layer that is a thin film of an alloy selected from the group consisting of a ternary alloy of gadolinium, iron and cobalt, and a binary alloy of gadolinium and cobalt,
   wherein the layers are stacked in the order recited either in direct contact with one another, respectively, or with at least one other layer intervening;
information rewrite means, electrically connected to the memory cell, for performing rewrite and erasure by passing a single-polarity electric pulse; and
readout means, electrically connected to the memory cell, for reading out stored information from an amount of current flowing through the magnetic memory element.

* * * * *